(12) United States Patent
Jackson (10) Patent No.: US 6,696,370 B2
(45) Date of Patent: Feb. 24, 2004

(54) AQUEOUS-BASED PHOTOLITHOGRAPHY ON ORGANIC MATERIALS

(75) Inventor: Thomas N. Jackson, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 09/882,360

(22) Filed: Jun. 15, 2001

(65) Prior Publication Data

US 2002/0022299 A1 Feb. 21, 2002

Related U.S. Application Data (60) Provisional application No. 60/212,189, filed on Jun. 16, 2000.

(51) Int. Cl.[7] .................... H01L 21/31; H01L 21/469
(52) U.S. Cl. .................... 438/780; 438/725; 438/99; 257/40; 257/192
(58) Field of Search .................... 438/780, 1, 725, 438/623, 99; 257/40, 192

(56) References Cited

U.S. PATENT DOCUMENTS

| | | | | |
|---|---|---|---|---|
| 3,615,461 A | * | 10/1971 | Kaplan | 96/36.1 |
| 4,745,042 A | * | 5/1988 | Sasago et al. | 430/156 |
| 5,998,092 A | * | 12/1999 | McCulloch et al. | 430/270.1 |
| 6,331,356 B1 | * | 12/2001 | Angelopoulos et al. | 428/411.1 |
| 6,498,114 B1 | * | 12/2002 | Amundson et al. | 438/780 |

FOREIGN PATENT DOCUMENTS

JP    55109310 A    *    8/1980

OTHER PUBLICATIONS

*High–Mobility, Low Voltage Organic Thin Film Transistors*, by David J. Gundlach et al., 1999, IEEE, pp. 5.2.1–5.2.4.
*Pentacene Organic Thin–Film Tansistors For Circuit and Display Applications*, by Hagan Klauk et al., IEEE, vol. 46, No. 6, Jun. 1999, pp. 1258–1263.
*Solvent–induced Phase Transition In Thermally Evaporate Pentacene Films*, by D.J Gundlach et al., vol. 74, No. 22, May 31, 1999, American Institute of Physics, pp. 3302–3304.

\* cited by examiner

Primary Examiner—Caridad Everhart
(74) Attorney, Agent, or Firm—Ohlandt, Greeley, Ruggiero & Perle, L.L.P.

(57) ABSTRACT

The present invention provides a process for preparing a patterned organic layer from an unpatterned water-soluble organic layer. The process includes the steps of: imagewise exposing to radiation a photosensitive unpatterned water-soluble organic layer deposited on an organic semiconducting material, a metal or an insulator layer, to produce an imagewise exposed organic layer having exposed and unexposed regions; and contacting the imagewise exposed organic layer and an aqueous-based developer to selectively remove the unexposed regions thereby producing the patterned organic layer. The present invention also provides an improved for fabricating an electronic device having a patterned organic layer adjacent to an organic semiconducting material, metal or insulator layer.

27 Claims, 4 Drawing Sheets

AQUEOUS-BASED PHOTOLITHOGRAPHY ON ORGANIC MATERIALS

This application claims priority from Provisional Application Serial No. 60/212,189 filed on Jun. 16, 2000.

BACKGROUND OF THE INVENTION

1. Field of the Invention

The present invention relates to a process for preparing a patterned organic layer from an unpatterned water-soluble organic layer. More particularly, the present invention relates to an improved for fabricating an electronic device having a patterned organic layer adjacent to an organic semiconducting material, metal or insulator layer.

2. Description of the Prior Art

A number of materials used in organic electronic and optoelectronic devices are degraded by exposure to organic solvents such as those used in photolithographic processing. For example, pentacene-based organic thin film transistors have demonstrated performance comparable to, or better than, devices fabricated using hydrogenated amorphous silicon active layers (D. J. Gundlach, H. Klauk, C. D. Sheraw, C. C. Kuo, J. R. Huang, and T. N. Jackson, "High-Mobility, Low Voltage Organic Thin Film Transistors." 1999 International Electron Devices Meeting Technical Digest, pp. 111–114, December 1999 and H. Klauk, D. J. Gundlach, J. A. Nichols, and T. N. Jackson, "Pentacene Organic Thin Film Transistors for Circuit and Display Applications," IEEE Transactions on Electron Devices, Vol. 46, No. 6., pp. 1258–1263, June 1999).

However, when deposited by vacuum evaporation, pentacene thin films typically grow in a thin film phase with an elongated c-axis compared to bulk crystals. Exposure to some organic solvents (isopropyl alcohol or acetone, for example) results in a solvent-induced phase transition to the bulk phase with an associated in-plane expansion (see, for example, D. J. Gundlach, T. N. Jackson, D. G. Schlom, and S. F. Nelson, "Solvent-Induced Phase Transition in Thermally Evaporated Pentacene Films," Applied Physics Letters, Vol. 74, No. 22, pp. 3302–3304, May 1999).

Figure 1:
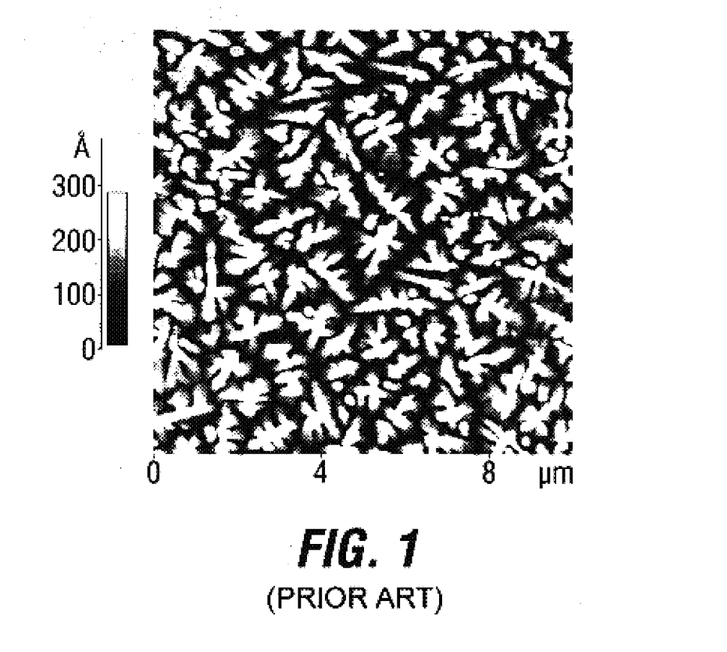
FIG. 1 shows an atomic force microscope image of pentacene thin film before exposure to isopropyl alcohol.
Figure 2:
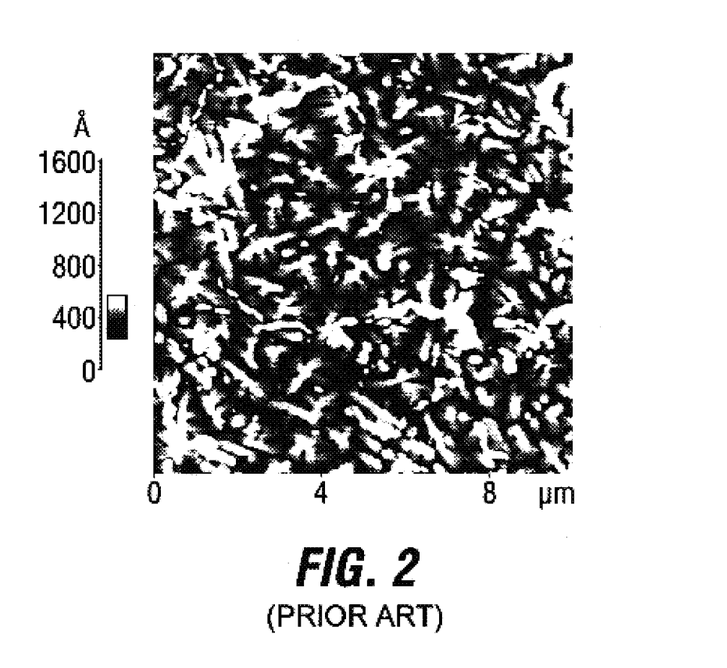
FIG. 2 shows an atomic force microscope image of pentacene thin film after exposure to isopropyl alcohol.

Such solvent-induced in-plane expansion results in buckling of the thin film and degraded device properties. FIG. 1 shows an atomic force microscope image of pentacene thin film before exposure to isopropyl alcohol. FIG. 2 shows an atomic force microscope image of pentacene thin film after exposure to isopropyl alcohol. The image in FIG. 2 shows film buckling (note the change in the vertical scale).

Similar organic solvent related degradation is also observed for devices fabricated with -sexithienyl or napthacene and for many other organic materials used for organic electronic and optoelectronic devices including organic thin film transistors and organic light emitting diodes. This degradation is problematic since it makes it difficult to do conventional photolithography on organic materials or with organic materials present.

The present invention provides an aqueous-based photolithographic process for preparing a patterned organic layer from an unpatterned water-soluble organic layer. This process uses water as both the solvent for the photosensitive material for solvent-casting in thin film form and for developing the image after exposure. As a result, the process of the present invention avoids the problems associated with organic solvents based conventional photolithography, such as, solvent-induced in-plane expansion, which results in buckling of the thin film and degraded device properties.

SUMMARY OF THE INVENTION

The present invention provides a process for preparing a patterned organic layer from an unpatterned water-soluble organic layer. The process includes the steps of:

imagewise exposing to radiation a photosensitive unpatterned water-soluble organic layer deposited on an organic semiconducting material, a metal or an insulator layer, to produce to produce an imagewise exposed organic layer having exposed and unexposed regions; and contacting the imagewise exposed organic layer and an aqueous-based developer to selectively remove the unexposed regions thereby producing the patterned organic layer.

The present invention further includes a process for preparing a patterned organic transistor layer on a transistor structure. This process includes the steps of:

applying onto an unpatterned organic transistor layer disposed on a transistor structure an aqueous solution including a photosensitive composition to produce an unpatterned photosensitive organic layer;

imagewise exposing the unpatterned photosensitive organic layer to radiation to produce an imagewise exposed organic layer having exposed and unexposed regions; and contacting the imagewise exposed organic layer and an aqueous-based developer to selectively remove the unexposed regions thereby producing a patterned organic layer on the unpatterned organic transistor layer.

The present invention still further includes a process for preparing a patterned organic diode layer on a diode structure. This process includes the steps of:

applying onto an unpatterned organic diode layer disposed on a diode structure an aqueous solution including a photosensitive composition to produce an unpatterned photosensitive organic layer;

imagewise exposing the unpatterned photosensitive organic layer to radiation to produce an imagewise exposed organic layer having exposed and unexposed regions; and contacting the imagewise exposed organic layer and an aqueous-based developer to selectively remove the unexposed regions thereby producing a patterned organic diode layer on the unpatterned organic diode layer.

Also provided is an improved process for fabricating an electronic device having a patterned organic layer adjacent to an organic semiconducting material, metal or insulator layer. The improvement includes the steps of:

imagewise exposing to radiation a photosensitive unpatterned water-soluble organic layer deposited on an organic semiconductor material, a metal or an insulator layer in the electronic device to produce an imagewise exposed organic layer having exposed and unexposed regions; and contacting the imagewise exposed organic layer and an aqueous-based developer to selectively remove the unexposed regions.

The present invention also includes the products prepared by any of the above processes.

The process of the present invention avoids the problems associated with organic solvents based conventional photolithography in which the organic solvents are used either as solvents for the photosensitive material or as a component of the developer.

DETAILED DESCRIPTION OF THE INVENTION

As an alternative to conventional photolithography which uses organic solvents, either as a solvent for the photosensitive material, as a developer, or both, and to avoid the buckling of the thin film and degraded device properties resulting from solvent-induced in-plane expansion, the present invention provides an aqueous-based photolithographic process. This process uses water as both the solvent for the photosensitive material for solvent-casting in thin film form and as a major component for developing the image after exposure.

In one aspect of the present invention, a photosensitive unpatterned water-soluble organic layer is deposited on an organic semiconducting material and thereafter imagewise exposed to radiation. This produces an imagewise exposed organic layer that has exposed and unexposed regions. The imagewise exposed organic layer is then contacted with an aqueous-based developer to selectively remove the unexposed regions. The selective removal of the unexposed regions produces a patterned organic layer. Preferably, the step of imagewise exposing to radiation is a step in fabricating an organic semiconductor or molecular semiconductor device.

The photosensitive unpatterned water-soluble organic layer is prepared by applying an aqueous solution including a photosensitive composition onto the organic semiconducting material. A number of water soluble gums and resins can be photosensitized and used in an aqueous-based processes of the present invention, i.e., photolithographic processes. For example, polyvinyl alcohol, hydroxyethyl cellulose, and a variety of animal gelatins can all be photosensitized by suitable addition of chromium ions, for example by mixing a small concentration of ammonium dichromate (or a similar dichromate or chromate). Alternatively, polyvinyl pyrrolidone can form water-soluble, light-hardenable colloids with no additional photosensistizer required.

Thus, the photosensitive composition can be a photosensitive organic material or it can be a combination of a photosensitizable organic material and a photosensitizer. Preferably, the photosensitive organic material is a dichromated or chromated colloid.

The photosensitizable organic material can be gelatin, albumin, casein, process glue, a natural gum, starch, nitrocellulose, alkylated cellulose, hydroxyalkylated cellulose, acylated cellulose, cellulose acetate, mixed cellulose ester, polyvinyl alcohol, polyvinyl acetal, polyvinyl butyral, halogenated polyvinyl alcohol or polyvinyl pyrrolidone. It can be in the form of a polymer or a copolymer and can include any combination of these materials.

Suitable photosensitizers include chromate or dichromate salts or a combination of chromate and dichromate salts of ammonium, quaternary ammonium, alkali metal cation, alkaline metal cation, including combinations thereof.

Typically, the aqueous solution of the photosensitive composition is applied by coatings methods known in the art, including methods, such as, spin coating, dip coating, roller coating, spray coating and solvent casting. Preferably, the coating step is carried out by solvent casting. However, other convenient coating methods known to those skilled in the art can also be used. To obtain the desired coating thickness, a single coating or multiple coatings may be applied to the substrate. Thus, one or more steps can be repeated.

The photosensitive unpatterned water-soluble organic layer can be photo-imaged. Preferably, the step of imagewise exposing is carried out using ultraviolet radiation. Upon such imaging the developer solubility of the imaged area is decreased to allow differentiation between imaged and non-imaged areas upon development. Typically, the step of exposing to ultraviolet radiation is carried out using a UV radiation source, such as a metal halide doped mercury lamp. Such radiation sources typically emit radiation in both the UV and visible spectral regions. Lasers and excimer lamps having appropriate emissions may also be used.

Following imagewise exposure by analog or digital means, an imaged element having exposed areas and complimentary unexposed areas is obtained. The exposed is developed with an aqueous-based developer to selectively remove the water soluble polymer materials from the unexposed regions.

The aqueous-based developer composition is preferably free of harsh chemicals to prevent solvent-induced in-plane expansion, which can result in buckling of the thin film and lead to degraded device properties. The pH of the aqueous-based developer is preferably within about 3 to about 11, depending on the nature of the composition. The development can be performed by any known manner, for instance, by pouring the aqueous-based developer on the surface, by immersing the exposed film in the aqueous-based developer or by spraying the surface with the aqueous-based developer.

Preferably, the semiconducting material, metal or insulator layers are components in a device structure. However, the processes of the present invention can also be employed in other non-electronic applications.

In the electronic applications of the present processes, the preferred device structures include organic transistors, organic light-emitting diodes and organic non-emitting diodes. Preferably, the semiconducting material is an organic material, such as pentacene, preferably in the form of a thin layer having a thickness of from about 2 to about 10,000 nm on a substrate, such as, metal, glass, plastic, thermoplastic polymer, thermoset polymer, organic material, inorganic material, diamond, diamond-like carbon, quartz, sapphire, silicon, gallium nitride or natural or synthetic fabric.

The processes of the present invention can further include the step of etching the organic semiconducting material, metal or insulator layer underlying the unexposed regions to produce a patterned organic semiconductor, metal or insulator layer. The etching is preferably carried out by dry etching, wet etching, laser ablation, physical erosion or a combination thereof.

The processes of the present invention can have additional steps that are conventionally used in electronic device fabrication. It can also have multiple layers of any of the semiconductor, metal or insulator layers.

In one embodiment, the process includes the further steps of applying onto the organic semiconducting material underlying the unexposed regions a conductive material to produce a patterned organic semiconductor layer having conducting and semiconducting regions; and etching the exposed regions and the semiconducting regions of the organic semiconducting material to produce a semiconductor layer having patterned conducting regions over patterned semiconducting regions.

The conductive material can be applied by known methods, such as, evaporation, sputtering, ion beam sputtering, physical vapor deposition, chemical vapor deposition, printing, inking, screening or metal organic deposition. A combination thereof may also be used.

By using the above approach, the patterning of the water soluble layer can be transferred to an underlying layer. In another embodiment, a patterned conducting layer can be brought into contact, for example, with an underlying conducting layer. Other variants of the above embodiments can be devised by one of ordinary skill in the art to employ the processes of the present invention in electronic device manufacture.

Illustrative of the use of an aqueous-based photolithographic process according to the present invention with an organic material is a process employing polyvinyl alcohol to isolate an organic thin film transistor as shown in FIGS. 3–8.

Figure 3:
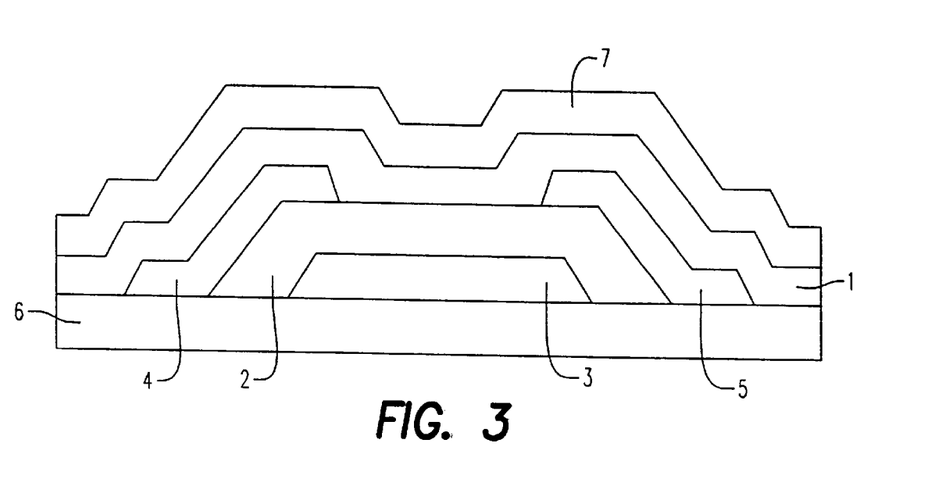
FIG. 3 shows an organic thin film transistor structure with an unpatterned organic thin film active layer 1.

Referring to FIG. 3, the process begins with an organic thin film transistor structure with an unpatterned organic thin film layer referred to as active layer 1, which in this case is pentacene, disposed on gate dielectric 2 over a gate electrode 3. An electric source 4 and an electric drain 5 are placed at two fixed points along the active layer 1 at a distance sufficient for a current to flow therethrough. The gate dielectric 2, gate electrode 3, electric source 4 and electric drain 5 are on a plastic or glass substrate 6, as shown in FIG. 3.

It is desirable to remove the pentacene in regions outside the active device to reduce leakage currents and crosstalk between devices. To achieve this, polyvinyl alcohol (PVA) photosensitized by the addition of a small concentration of ammonium dichromate is solvent-cast from a water solution to form a polyvinyl alcohol thin film 7 on the organic transistor.

Figure 4:
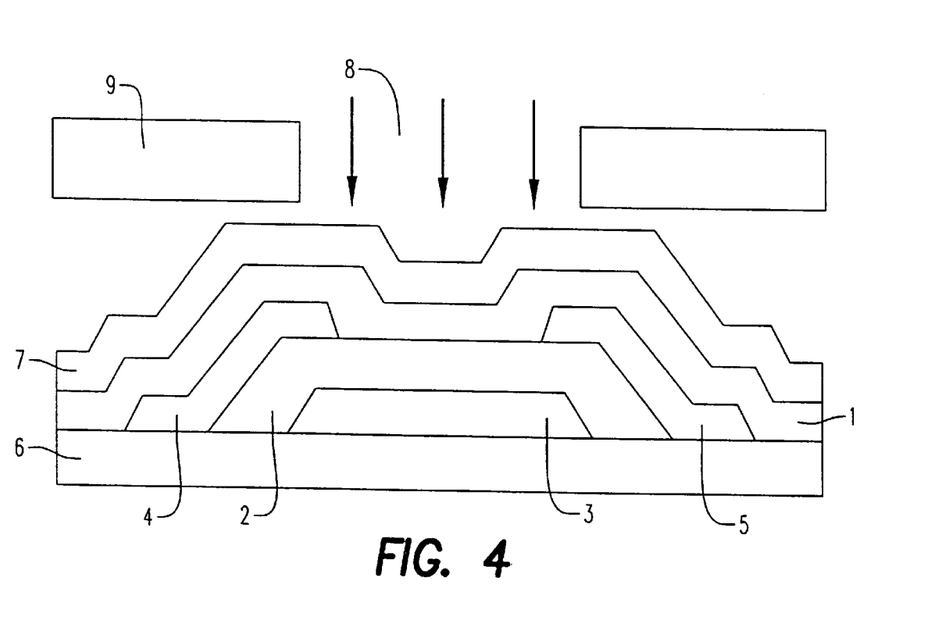
FIG. 4 shows exposure of a photosensitive PVA layer to ultraviolet light through a mask.

Referring to FIG. 4, the photosensitive PVA layer 7 is exposed to ultraviolet light 8 through a mask 9. The exposure hardens the PVA layer in the region exposed to the ultraviolet light and reduces its solubility in water.

Figure 5:
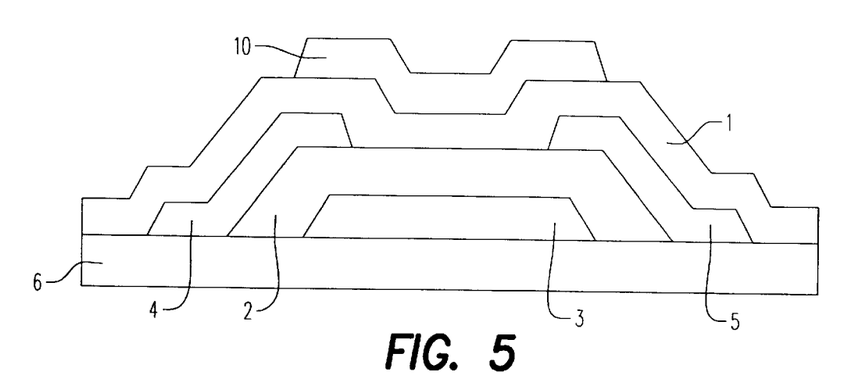
FIG. 5 depicts the exposed PVA layer after it is developed in water.

FIG. 5 depicts the exposed PVA layer after it is developed in water, or in a water-based developer. The unexposed PVA has been removed in this step while the exposed PVA 10, which has reduced solubility in water, remains to produce a patterned organic film 11 on the active layer 1, which in this case is a pentacene layer. The patterned organic film 11, which in this case is the PVA film 11, can then be used in subsequent processing just as a conventional, organic solvent based photoresist would.

Figure 6:
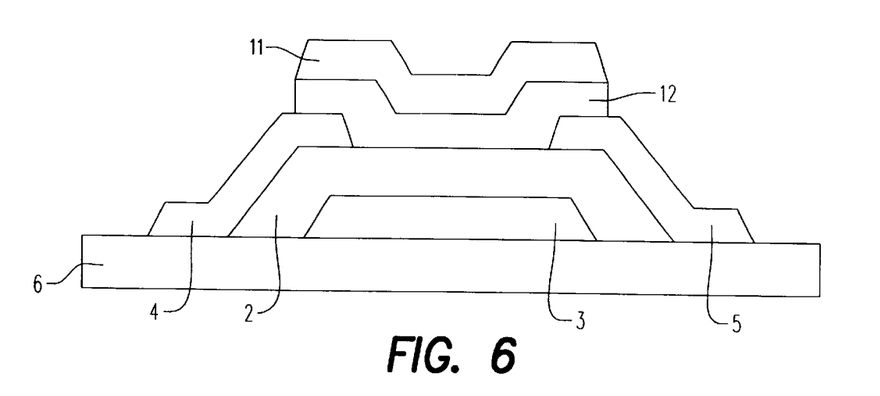
FIG. 6 illustrates an embodiment of the present invention in which the pattern of the water soluble organic layer is transferred to the underlying layer.

FIG. 6 illustrates an embodiment of the present invention in which the pattern of the water soluble organic layer is transferred to the underlying layer. The PVA layer 11 is used as a mask to pattern the underlying organic thin film by either wet or dry etching to produce a patterned active layer, which in this case is patterned pentacene layer 12. Thus, in this embodiment of the present invention, the pattern of the PVA layer 11 has been transferred to the underlying pentacene layer 12.

Figure 7:
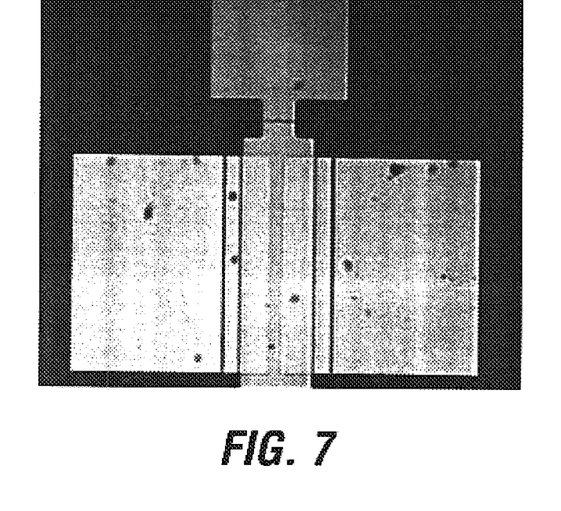
FIG. 7 shows photomicrograph of a discrete pentacene organic thin film transistor before patterning the photosensitized polyvinyl alcohol (PVA) active layer.
Figure 8:
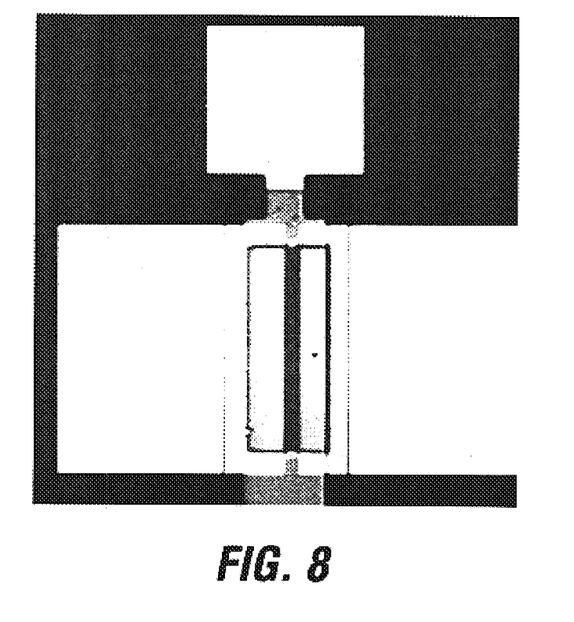
FIG. 8 shows photomicrograph of a discrete pentacene organic thin film transistor after patterning the photosensitized polyvinyl alcohol (PVA) active layer.

FIG. 7 and FIG. 8 show photomicrographs of a discrete pentacene organic thin film transistor, before (FIG. 7) and after (FIG. 8) patterning photosensitized polyvinyl alcohol (PVA) active layer using an aqueous-based photolithograpic process according to the present invention.

The aqueous-based photolithographic process according to the present invention can be used to pattern a wide variety of organic electronic and optoelectronic devices including transistors, diodes, light emitting diodes, sensors, and passive components. Many alternatives to PVA are possible, including other water-soluble materials that can be photosensitized by the addition of a photosensitizing agent, for example, ammonium dichromate used in the above examples.

The present invention can provide both negative and positive tone photosensitivity. In addition, a single component organic material having the intrinsic property of being photosensitive, such as a photosensitive water-soluble gum or resin, can also be used in the processes of the present invention.

Alternative work-up and isolation procedures are also possible, and will be evident to those skilled in the art.

The present invention has been described with particular reference to the preferred embodiments. It should be understood that the foregoing descriptions and examples are only illustrative of the invention. Various alternatives and modifications thereof can be devised by those skilled in the art without departing from the spirit and scope of the present invention. Accordingly, the present invention is intended to embrace all such alternatives, modifications, and variations that fall within the scope of the appended claims.

What is claimed is:

1. A process for preparing a patterned organic layer from an unpatterned water-soluble organic layer, comprising the steps of:

imagewise exposing to radiation a photosensitive unpatterned water-soluble organic layer deposited on an organic semiconducting material, a metal or an insulator layer, to produce an imagewise exposed organic layer having exposed and unexposed regions; and contacting said imagewise exposed organic layer and an aqueous-based developer to selectively remove said unexposed regions thereby producing said patterned organic layer;

wherein said step of imagewise exposing to radiation is a step in fabricating an organic semiconductor or molecular semiconductor device.

2. The process of claim 1, wherein said photosensitive unpatterned water-soluble organic layer is prepared by a process comprising the step of: applying onto said organic semiconducting material an aqueous solution comprising a photosensitive composition.

3. The process of claim 2, wherein said photosensitive composition is selected from the group consisting of: a photosensitive organic material and a combination of a photosensitizable organic material and a photosensitizer.

4. The process of claim 3, wherein said photosensitive organic material is a dicromated colloid.

5. The process of claim 3, wherein said photosensitizable organic material is selected from the group consisting of:

gelatin, albumin, casein, process glue, a natural gum, starch, nitrocellulose, alkylated cellulose, hydroxyalkylated cellulose, acylated cellulose, cellulose acetate, mixed cellulose ester, polyvinyl alcohol, polyvinyl acetal, polyvinyl butyral, halogenated polyvinyl alcohol, polyvinyl pyrrolidone, copolymers thereof, and a combination thereof.

6. The process of claim 3, wherein said photosensitizer is selected from the group consisting of: a chromate salt, a dichromate salt and a combination thereof.

7. The process of claim 3, wherein the cation of said chromate or dichromate salt is selected from the group consisting of: ammonium, quaternary ammonium, alkali metal cation, alkaline metal cation and a combination thereof.

8. The process of claim 2, wherein said aqueous solution of said photosensitive composition is applied by a process selected from the group consisting of: spin coating, dip coating, roller coating, spray coating and solvent casting.

9. The process of claim 8, wherein said step of coating is carried out by solvent casting.

10. The process of claim 1, wherein said semiconducting material, said metal or said insulator layers are components in a device structure.

11. The process of claim 10, wherein said device structure is selected from the group consisting of: an organic transistor, an organic light-emitting diode and an organic non-emitting diode.

12. The process of claim 1, wherein said semiconducting material is an organic material.

13. The process of claim 12, wherein said organic semiconducting material is pentacene.

14. The process of claim 1, wherein said semiconducting material is in the form of a thin layer on a substrate.

15. The process of claim 14, wherein said semiconducting material has a thickness of from about 3 to about 10,000 nm.

16. The process of claim 14, wherein said substrate is selected from the group consisting of: metal, glass, plastic, thermoplastic polymer, thermoset polymer, organic material, inorganic material, diamond, diamond-like carbon, quartz, sapphire, silicon, gallium nitride and natural or synthetic fabric.

17. The process of claim 1, further comprising:
depositing on said patterned organic layer an additional layer comprising a material selected from the group consisting of: an organic semiconducting material, a metal or an insulator.

18. The process of claim 17, wherein said additional layer is a metal layer.

19. The process of claim 18, wherein said metal layer is in contact with an underlying layer through a mask comprising said organic patterned layer.

20. A process for preparing a patterned organic layer from an unpatterned water-soluble organic layer, comprising the steps of:
imagewise exposing to radiation a photosensitive unpatterned water-soluble organic layer deposited on an organic semiconducting material, a metal or an insulator layer, to produce an imagewise exposed organic layer having exposed and unexposed regions; and
contacting said imagewise exposed organic layer and an aqueous-based developer to selectively remove said unexposed regions thereby producing said patterned organic layer
etching said organic semiconducting material underlying the unexposed regions to produce a patterned organic semiconductor layer, wherein said etching is carried out by a method selected from the group consisting of: dry etching, wet etching, laser ablation, physical erosion and a combination thereof.

21. A process for preparing a patterned organic layer from an unpatterned water-soluble organic layer, comprising the steps of:
imagewise exposing to radiation a photosensitive unpatterned water-soluble organic layer deposited on an organic semiconducting material, a metal or an insulator layer, to produce an imagewise exposed organic layer having exposed and unexposed regions; and
contacting said imagewise exposed organic layer and an aqueous-based developer to selectively remove said unexposed regions thereby producing said patterned organic layer
applying onto said organic semiconducting material underlying the unexposed regions a conductive material to produce a patterned organic semiconductor layer having conducting and semiconducting regions; and
etching said exposed regions and said semiconducting regions of said organic semiconducting material to produce a semiconductor layer having patterned conducting regions over patterned semiconducting regions.

22. The process of claim 21, wherein said conductive material is applied by a method selected from the group consisting of: evaporation, sputtering, ion beam sputtering, physical vapor deposition, chemical vapor deposition, printing, inking, screening, metal organic deposition and a combination thereof.

23. A process for preparing a patterned organic semiconductor layer on a transistor structure, comprising the steps of:
applying onto an unpatterned organic semiconductor layer disposed on a transistor structure an aqueous solution comprising a photosensitive composition to produce an unpatterned photosensitive organic layer;
imagewise exposing said unpatterned photosensitive organic layer to radiation to produce an imagewise exposed organic layer having exposed and unexposed regions; and
contacting said imagewise exposed organic layer and an aqueous-based developer to selectively remove said unexposed regions thereby producing a patterned organic layer on said unpatterned organic semiconductor layer.

24. The process of claim 23, further comprising:
etching said unpatterned organic semiconductor layer to produce a patterned organic semiconductor layer on said transistor structure.

25. A process for preparing a patterned organic semiconductor layer on a diode structure, comprising the steps of:
applying onto an unpatterned organic semiconductor layer disposed on a diode structure an aqueous solution comprising a photosensitive composition to produce an unpatterned photosensitive organic layer;
imagewise exposing said unpatterned photosensitive organic layer to radiation to produce an imagewise exposed organic layer having exposed and unexposed regions; and
contacting said imagewise exposed organic layer and an aqueous-based developer to selectively remove said unexposed regions thereby producing a patterned organic semiconductor layer on said organic diode structure.

26. The process of claim 25, wherein said diode structure is selected from the group consisting of: an organic light-emitting diode and an organic non-emitting diode.

27. The process of claim 25, further comprising:
etching said unpatterned organic semiconductor layer to produce a patterned organic semiconductor layer on said diode structure.

* * * * *

UNITED STATES PATENT AND TRADEMARK OFFICE
CERTIFICATE OF CORRECTION

PATENT NO.    : 6,696,370 B2
DATED         : February 24, 2004
INVENTOR(S)   : Thomas N. Jackson It is certified that error appears in the above-identified patent and that said Letters Patent is hereby corrected as shown below:

Column 1,
Line 2, after the "." to read as follows; -- This invention was made with support from the United States Government under DARPA/Air Force Contract No. F33615-98-1-5164. The Government may have certain rights in the Invention. --

Signed and Sealed this

Twenty-second Day of March, 2005

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,696,370 B2 | Page 1 of 1 |
| APPLICATION NO. | : 09/882360 | |
| DATED | : February 24, 2004 | |
| INVENTOR(S) | : Thomas N. Jackson | |

It is certified that error appears in the above-identified patent and that said Letters Patent is hereby corrected as shown below:

Column 1, line 3, insert:

--This invention was made with government support under Contract No. N00014-98-1-0846, awarded by the Office of Naval Research. The Government has certain rights in the invention.--

Signed and Sealed this

Thirtieth Day of November, 2010

David J. Kappos
*Director of the United States Patent and Trademark Office*